United States Patent [19]

Kim

[11] Patent Number: 5,757,812
[45] Date of Patent: May 26, 1998

[54] ERROR CORRECTION DEVICE FOR DIGITAL VIDEO APPARATUS USING A ONE-BIT ERASER SIGNAL

[75] Inventor: Tong-Ha Kim, Seoul, Rep. of Korea

[73] Assignee: Samsung Electronics Co., Ltd., Kyungki-Do, Rep. of Korea

[21] Appl. No.: 723,304

[22] Filed: Sep. 30, 1996

[30] Foreign Application Priority Data

Sep. 29, 1995 [KR] Rep. of Korea ............. 95-33032

[51] Int. Cl.⁶ ........................................... G06F 11/00
[52] U.S. Cl. ............................... 371/5.1; 371/30; 371/48
[58] Field of Search ............................ 371/5.1, 30, 48

[56] References Cited

U.S. PATENT DOCUMENTS 5,475,401  12/1995  Vervier et al. ........................ 345/179

*Primary Examiner*—Phung Chung
*Attorney, Agent, or Firm*—Sughrue, Mion, Zinn, Macpeak & Seas, PLLC

[57] ABSTRACT

An error correction device for a digital video apparatus using a one-bit eraser signal is described. The error correction device includes an eraser occurrence counter for counting the eraser signal and generating a frequency signal of an eraser generated for each codeword of the received data, an eraser position detector for storing a position value in the codeword of the received data when the eraser signal is input and generating a position signal of the eraser generated for each codeword of the received data, and an error corrector for receiving the eraser frequency signal and the eraser position signal respectively from the eraser occurrence counter and the eraser position detector and correcting the eraser generated in the codeword of the received data, to thereby remarkably reduce the number of input pins in the decoder.

8 Claims, 7 Drawing Sheets

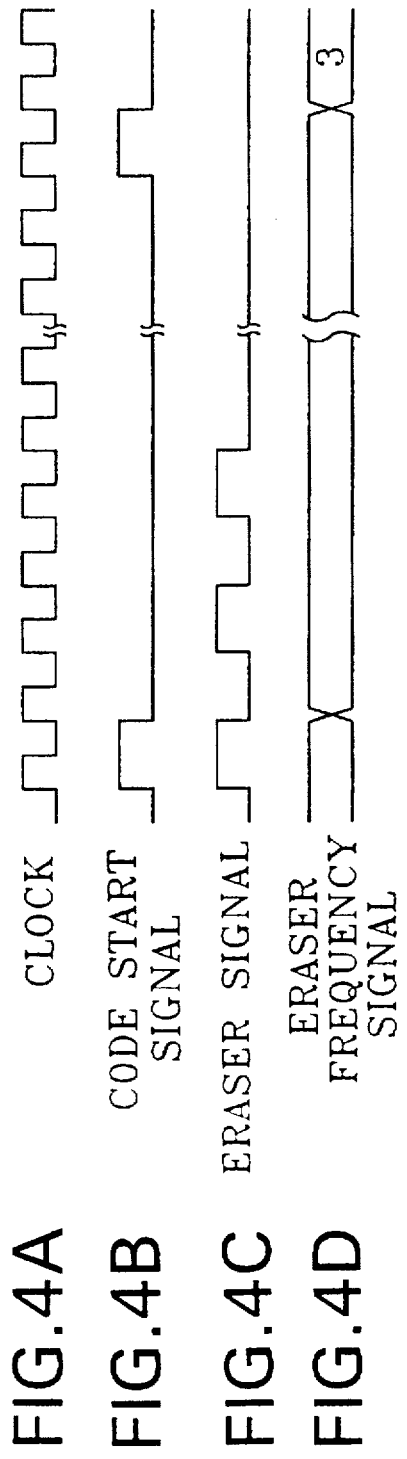

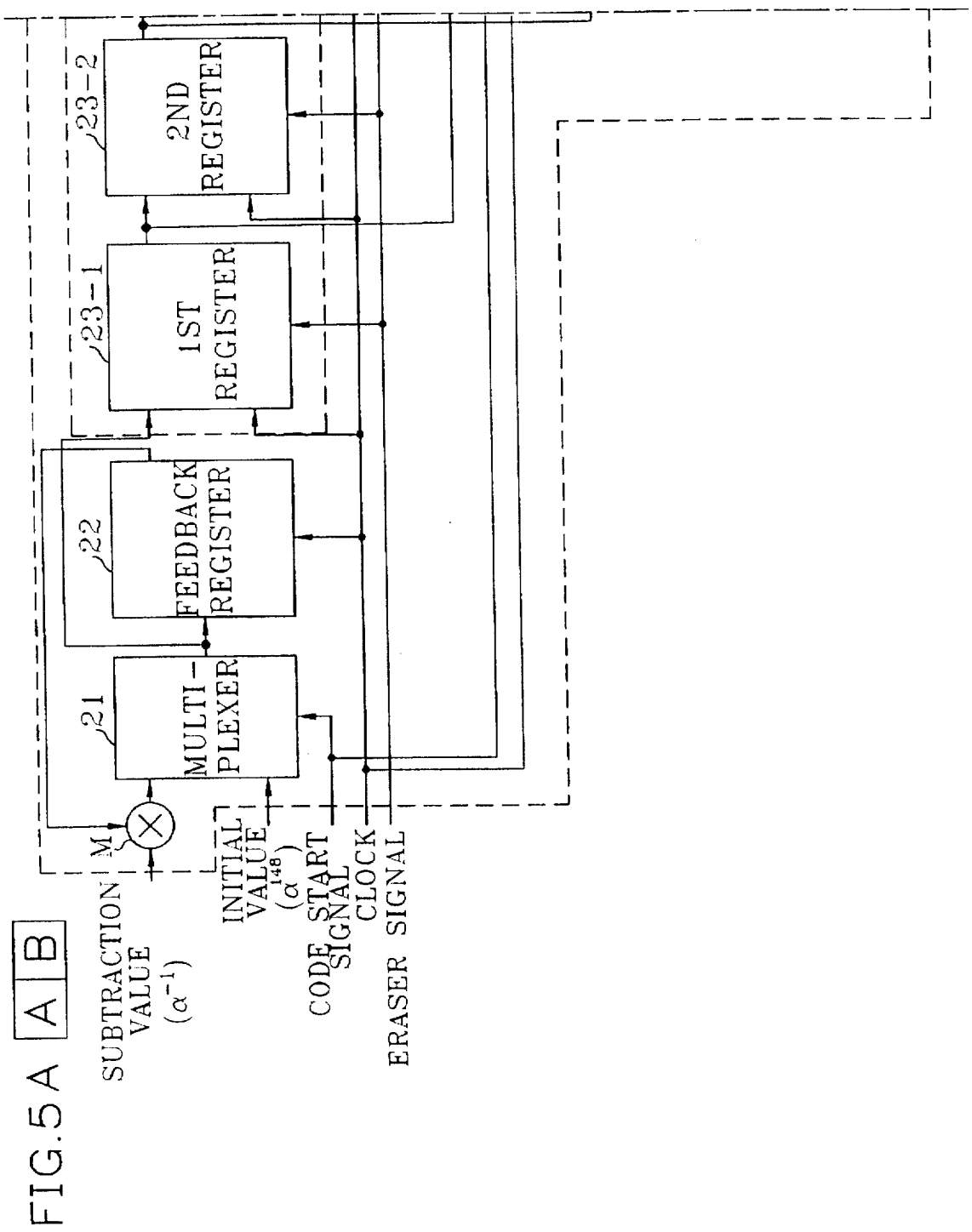

FIG.6A CODE START SIGNAL
FIG.6B u[0](7:0) $\alpha^{148}$
FIG.6C u[1](7:0) $\alpha^{146}$
FIG.6D u[2](7:0) $\alpha^{144}$
FIG.6E u[3](7:0) don't care
FIG.6F u[4](7:0) don't care
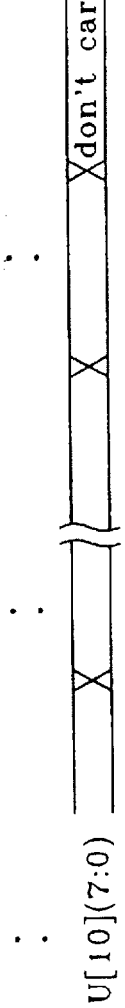
FIG.6G u[10](7:0) don't care

ERROR CORRECTION DEVICE FOR DIGITAL VIDEO APPARATUS USING A ONE-BIT ERASER SIGNAL

BACKGROUND OF THE INVENTION

The present invention relates to an error correction device for a digital video apparatus, and more particularly, to a device for receiving a one-bit transmission erasure signal and detecting the number of times of occurrence and position of the erasure.

Generally, a codeword produced in an encoder frequently creates errors due to noise generated passing through a transmission line. Thus, a decoder in a receiving end should judge absence or presence of the error of the received data, and perform an error correction signal process. A Reed Solomon (RS) code is known as a code system having an excellent correction capability in which errors generated in the received digital data are corrected and the received digital data is restored into original data.

An error generated in received data is called a single error, while at least two errors generated therein are called a multiple error. This error is divided into one case where an error generation position can be seen and the other case where the error generation position cannot be seen. The latter error is specifically called an eraser.

An error correction device in a decoding end receives information with respect to the number of times of occurrence of erasers and the positions thereof and corrects the eraser of the received data, which will be described below in more detail, referring to FIG. 1.

FIG. 1 shows a conventional decoder for correcting the erasers of received data. FIG. 1 shows an example of the decoder 1 which can correct three errors of the received data and six erasers thereof. Here, since the number of times of occurrence of the erasers is a maximum of six, three bits are needed to represent the number of times of occurrence thereof.

The decoder 1 receives 8-bit information data according to a predetermined clock. The decoder 1 also receives a 3-bit eraser frequency signal and an 8-bit eraser position signal. Then, using signals with respect to these erasers, the erasers generated in the information data are corrected and the corrected information data is output.

In this case, it can be seen that 11-bit data is needed to inform the receiving end of the number of times of occurrence and position of the erasers. Thus, the decoder should include a number of input pins. As the error correction capability increases, the more number of the input pins should be included.

SUMMARY OF THE INVENTION

To solve the above problem, it is an object of the present invention to provide a device for detecting the frequency of occurrence of the eraser and the position on received information data, using an eraser signal indicating that an eraser is in the corresponding position of received information data, and for correcting an eraser of the received information data.

To accomplish the above object of the present invention, there is provided an error correction device for correcting an eraser of received information data using the eraser signal which is transmitted together with the eraser, the error correction device comprising:

eraser occurrence counting means for counting the eraser signal indicating that eraser is present in the corresponding position of received information data and generating a frequency signal of an eraser generated for each codeword of the received information data;

eraser position detecting means for storing a position value in the codeword of the received data when the eraser signal is input and generating a position signal of the eraser generated for each codeword of the received data; and error correction means for receiving the eraser frequency signal and the eraser position signal respectively from the eraser occurrence counting means and the eraser position detecting means and correcting the eraser generated in the codeword of the received data.

BRIEF DESCRIPTION OF THE DRAWINGS

The preferred embodiments are described with reference to the drawings wherein:

FIG. 4 shows wave form diagrams for explaining the operation of the counter of FIG. 3.

FIGS. 5A and 5B are detailed block diagrams showing the eraser position detector 20 of FIG. 2.

FIG. 6 shows waveform diagrams for explaining the operation of the detector of FIG. 5.

DETAILED DESCRIPTION OF THE PREFERRED EMBODIMENT

A preferred embodiment of the present invention will be described below in more detail with reference to FIGS. 2 through 6.

Figure 1:
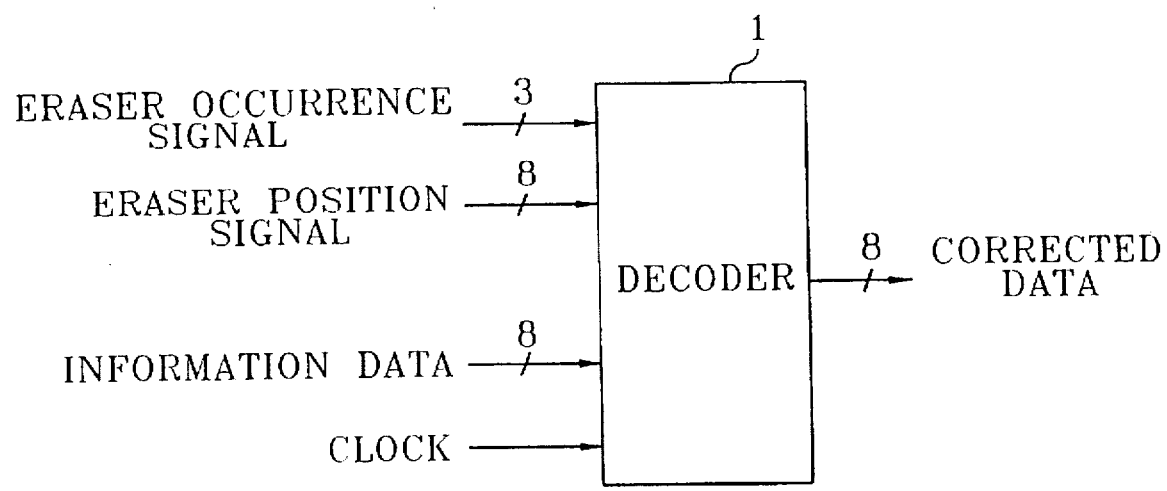
FIG. 1 is a constitutional diagram of a conventional error correction decoder.
Figure 2:
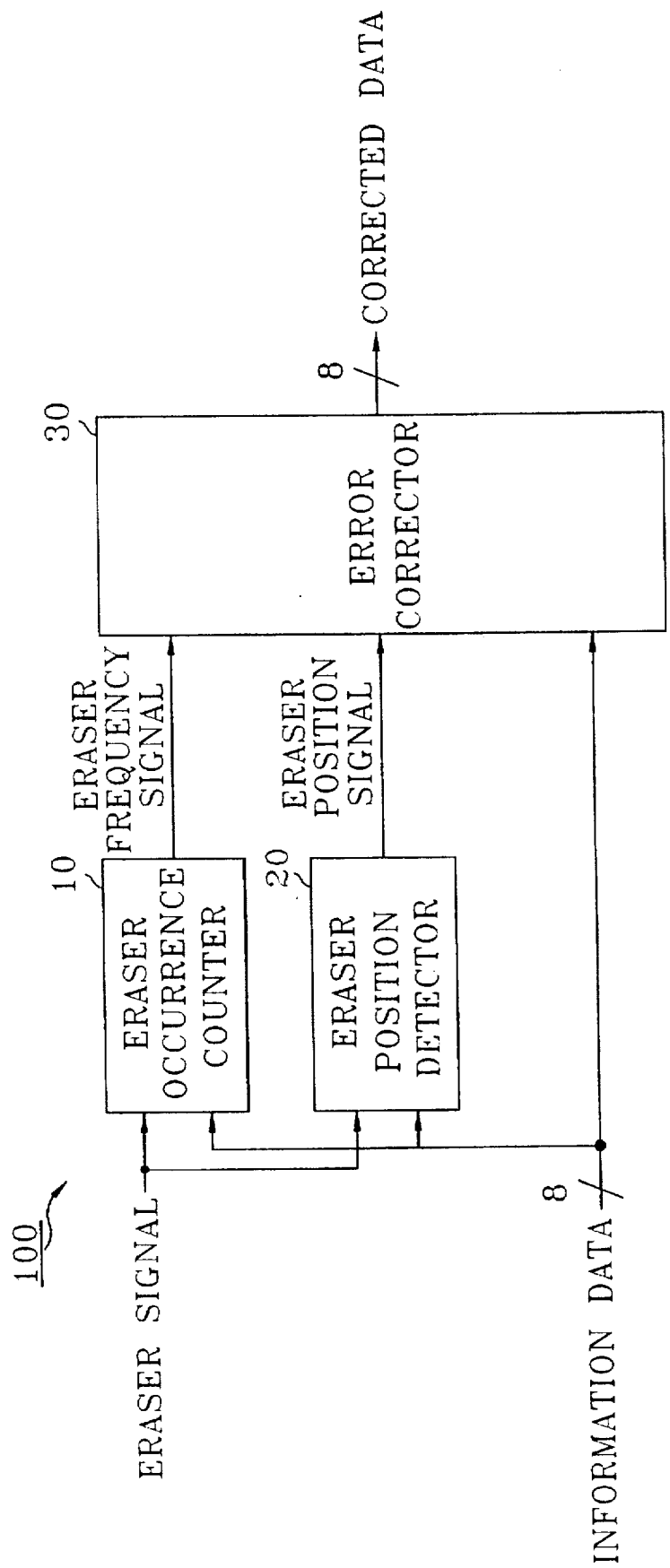
FIG. 2 is a block diagram showing an error correction device in a digital video apparatus according to a preferred embodiment of the present invention.

Referring to FIG. 2, an error correction device 100 receives information data and an eraser signal. Here, the eraser signal input to the error correction device 100 is a one-bit signal. That is, an encoder transmits the information data and the one-bit eraser signal, simultaneously. When the information data regarding the eraser is transmitted, a high-level eraser signal is transmitted, which completes transmission of the information on the eraser.

An eraser occurrence counter 10 in the error correction device 100 receives the eraser signal and the information data and counts the number of times of occurrence of the eraser to generate an eraser frequency signal. An eraser position detector 20 therein receives the eraser signal and the information data and detects the position of the eraser to generate an eraser position signal. An error corrector 30 therein receives the eraser frequency signal, the eraser position signal and the information data and corrects errors generated in the information data.

Figure 3:
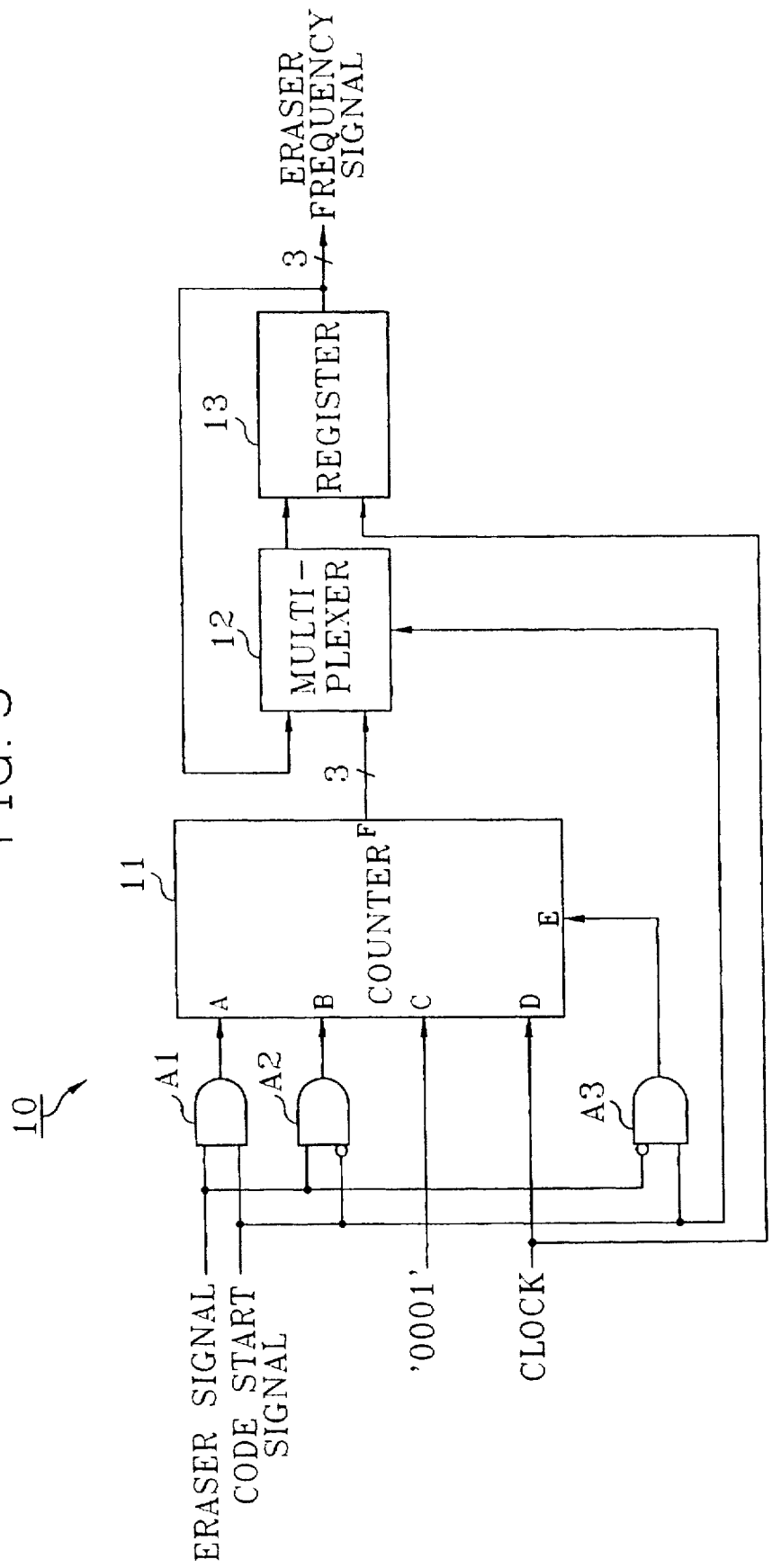
FIG. 3 is a detailed block diagram showing the eraser occurrence counter 10 of FIG. 2.
Figure 5B:
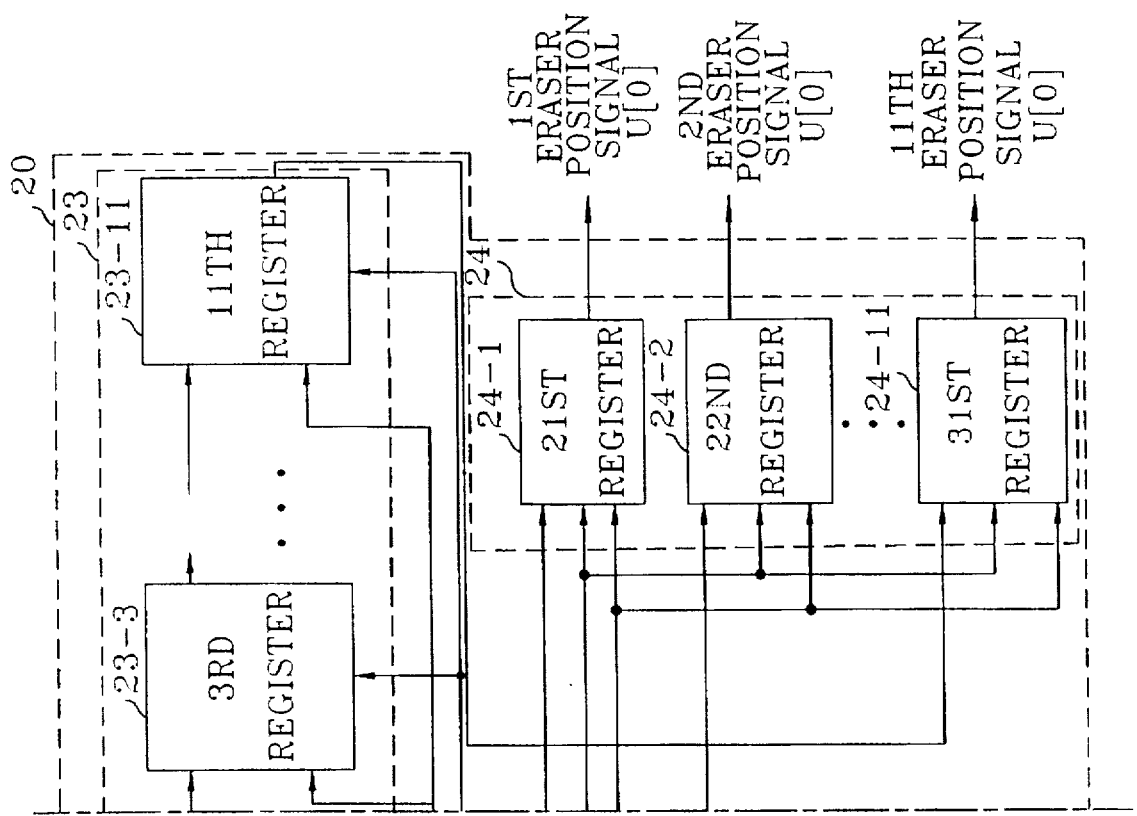

FIGS. 3 and 5(A–B) show a detailed construction of each element of the error correction device 100. FIG. 3 is a detailed block diagram showing the eraser occurrence counter 10 of FIG. 2. A counter 11 in the eraser occurrence counter 10 of FIG. 3 increases a count value whenever a high-level eraser signal is input and generates an eraser frequency signal. A first AND gate A1 for detecting a case of generating an eraser at the time of receiving a code start signal indicating the start of an RS code is connected to one of input ends of the counter 11. Also, a second AND gate A2 for determining an initial value when an eraser is not generated at the time of receiving the code start signal, and a third AND gate A3 for detecting an eraser after receiving the code start signal are connected to the other input ends of the counter 11, respectively. A multiplexer 12 connected to the output end of the counter 11 outputs the eraser frequency signal output from the counter 11 when a next code start signal is input. A register 13 receives the output of the multiplexer 12 and stores it for a predetermined time, to then output the stored data.

FIG. 4 shows waveform diagrams for explaining the operation of the eraser occurrence counter 10 of FIG. 3.

The eraser occurrence counter 10 of FIG. 3 detects the input eraser signal and counts the number of times thereof. In more detail, the counter 11 in the eraser occurrence counter 10 initializes a count value if a code start signal indicating the start of each codeword in the information data is input therein. Then, the counter 11 increases the count value whenever the eraser signal is detected and then generates an eraser frequency signal. In this case, the counter 11 determines an intial value considering a case where an eraser signal is detected at the time of receiving a code start signal. That is, the third AND gate A3 logically multiplies the code start signal by the inverted input eraser signal. The output of the third AND gate A3 becomes a binary value "1" when an eraser signal is not detected at the time of the start of the codeword. The counter 11 initializes the count value into "0" when a binary value "1" is input from the third AND gate A3. Meanwhile, the first AND gate A1 logically multiplies the eraser signal by the code start signal. The output of the first AND gate A1 becomes a binary value "1" when an eraser signal is detected from the time of the start of the codeword, as shown in FIG. 4. The counter 11 receives a binary value "1" from the first AND gate A1 and the count value becomes "1". The second AND gate A2 logically multiplies the eraser signal by the inverted input code start signal. That is, when the eraser signal is detected after receiving the code start signal, the second AND gate A2 generates a binary value "1". Whenever the counter 11 receives a binary value "1" from the second AND gate A2, it adds an increment value (0001) to the previous count value to increase the count value. Then, the counter 11 outputs the count value to the multiplexer 12. The multiplexer 12 outputs the previous stored value of the register 13 fedback from the register 13 and selects the output of the counter 11 if a code start signal is input thereto. The register 13 temporarily stores the eraser frequency signal output from the multiplexer 12 and then outputs the stored signal to the error corrector 30. As such, the signal output from the register 13 indicates the number of the erasers generated for every codeword. The error corrector 30 uses the eraser frequency signal to correct the eraser.

FIGS. 5(A–B) show a detailed block diagram of the eraser position detector 20 of FIG. 2.

Referring to FIGS. 5(A–B), a multiplexer 21 receives an initial value $\alpha^{148}$ and the output of a multiplier M and outputs a value of each position of the codeword calculated from the initial values $\alpha^{148}$. For this purpose, a feedback register 22 applies the output of the multiplexer 21 to the multiplier M and supplies the result multiplied by a subtraction value $\alpha^{-1}$ to the multiplexer 21. Meanwhile, a first storage unit 23 includes a predetermined number of registers 23-1 through 23-11, among which a first register 23-1 receives the output of the multiplexer 21. The registers in the first storage unit 23 shift the stored value to the next registers which are respectively connected thereto whenever an eraser signal is input. A second storage unit 24 includes registers 24-1 through 24-11 of which the number is the same as that of the registers in the first storage unit 23. The respective registers 24-1 through 24-11 are individually connected to the registers 23-1 through 23-11 in the first storage unit 23. The registers 24-1 through 24-11 in the second storage unit 24 temporarily store the eraser position signals applied from the registers 23-1 through 23-11 in the first storage unit 23 and output the stored eraser position signals, respectively.

FIG. 6 shows waveform diagrams for explaining the operation of the eraser position detector 20 of FIGS. 5(A–B). The eraser position detector 20 of FIGS. 5(A–B) show an example where RS codes 149 and 138 are used. Here, when an eraser signal is generated at the time of receiving a code start signal, the position of an eraser becomes $\alpha^{148}$. Then, each position value of the codeword becomes $\alpha^{147}, \alpha^{146}, \ldots, \alpha^2, \alpha^1$ or $\alpha^0$ whenever the clock is generated.

The multiplexer 21 outputs an initial value $\alpha_{148}$ when a code start signal is input. The output of the multiplexer 21 is input to the multiplier M via the feedback register 22. The multiplier M multiplies the previous position value applied from the feedback register 22 by the subtraction value $\alpha^{-1}$ and outputs the result to the multiplexer 21. The multiplexer 21 selects the output value of the multiplier M when a code start signal is a low-level value to output the selected value. The output of the multiplexer 21 represents the position of the current codeword.

The output of the multiplexer 21 is also input to the first register 23-1 of the first storage unit 23. The first register 23-1 latches the output of the multiplexer 21 when an eraser is input therein. That is, the value stored in the first register 23-1 represents the position where an eraser signal has been initially detected. The first register 23-1 shifts the stored value to the second register 23-2 when a next eraser signal is input therein and stores a current eraser position value applied from the multiplexer 21. When the RS codes 149 and 138 are used as shown in FIGS. 5(A–B), at least five errors can be corrected, and at least eleven erasers can be corrected. Thus, each of the registers 23-1 through 23-11 in the first storage unit 23 outputs its own stored value to the registers 24-1 through 24-11 in the second storage unit 24 when a next code start signal is input therein. The second storage unit 24 temporarily stores the value applied from the first storage unit 24 and outputs the stored value to the error corrector 30.

The error corrector 30 of FIG. 2 receives the eraser frequency signal and eraser position signal and corrects the eraser generated in the information data. here, as shown in FIG. 4, assuming that the eraser frequency signal applied from the eraser occurrence counter 10 is "3," the eraser position signal applied from the second storage unit 24 in the eraser position detector 20 has three initial significant values and the other remaining values of "don't care" as shown in FIG. 6.

As described above, the present invention detects the number of times of occurrence of erasers and the position thereof using a one-bit eraser signal transmitted together with information data to correct the eraser in received data and remarkably reduce the number of input pins in a decoder.

While only certain embodiments of the invention have been specifically described herein, it will be apparent that numerous modifications may be made thereto without departing from the spirit and scope of the invention.

What is claimed is:

1. An error correction device for correcting an eraser of received information data using an eraser signal which is transmitted together with the eraser, the error correction device comprising:

- eraser occurrence counting means for counting the eraser signal indicating that the eraser is in a corresponding position of received information data and generating an eraser frequency signal for each codeword of the received information data;
- eraser position detecting means for storing a position value in the codeword of the received data when the eraser signal is input and generating an eraser position signal for each codeword of the received data; and
- error correction means for receiving the eraser frequency signal and the eraser position signal respectively from said eraser occurrence counting means and said eraser position detecting means and correcting the eraser generated in the codeword of the received data.

2. The error correction device for a digital video apparatus according to claim 1, wherein said eraser occurrence counting means counts "1" when a code start signal indicating the start of the codeword is input at the same time the eraser signal is input, and initializes the frequency signal as "0" when the eraser signal is not input when the code start signal is input.

3. The error correction device for a digital video apparatus according to claim 2, wherein said eraser occurrence counting means further comprises:

- a first AND gate for logically multiplying the eraser signal by the code start signal;
- a second AND gate for logically multiplying the eraser signal by an inverted code start signal; and
- a third AND gate for logically multiplying the code start signal by an inverted eraser signal.

4. The error correction device for a digital video apparatus according to claim 1, wherein said eraser occurrence counting means comprises a counter.

5. The error correction device for a digital video apparatus according to claim 3, wherein said eraser occurrence counting means further comprises:

- a first AND gate for logically multiplying the eraser signal by the code start signal;
- a second AND gate for logically multiplying the eraser signal by an inverted input code start signal; and
- a third AND gate for logically multiplying the code start signal by an inverted eraser signal.

6. The error correction device for a digital video apparatus according to claim 1, wherein said eraser position detection means comprises:

- a position value generator for generating position values in the codeword; and
- a storage unit for latching the position values generated in said position value generator and storing the latched values when the eraser signal is input.

7. The error correction device for a digital video apparatus according to claim 6, wherein said position value generator comprises:

- a multiplier for multiplying a next-previous position value of the codeword by a predetermined subtraction value and generating a current position value; and
- a multiplexer for outputting an initial value indicating a length of the codeword when the code start signal indicating the start of the codeword is input, and outputting the current position value of the codeword supplied from said multiplier.

8. The error correction device for a digital video apparatus according to claim 6, wherein said storage unit comprises registers for shifting the position values whenever the eraser signal is input and storing the shifted values.

* * * * *